United States Patent [19]

Gerrath

[11] Patent Number: 4,789,953
[45] Date of Patent: Dec. 6, 1988

[54] CIRCUIT ARRANGEMENT FOR AVERAGING

[75] Inventor: Karl-Heinz Gerrath, Griesheim, Fed. Rep. of Germany

[73] Assignee: Battelle-Institut e.V., Frankfurt am Main, Fed. Rep. of Germany

[21] Appl. No.: 912,606

[22] PCT Filed: Dec. 20, 1985

[86] PCT No.: PCT/EP85/00729
§ 371 Date: Sep. 4, 1986
§ 102(e) Date: Sep. 4, 1986

[87] PCT Pub. No.: WO86/05594
PCT Pub. Date: Sep. 25, 1986

[30] Foreign Application Priority Data

Mar. 19, 1985 [DE] Fed. Rep. of Germany ....... 3509762

[51] Int. Cl.⁴ .............................................. G06F 15/36
[52] U.S. Cl. ................. 364/724.01; 364/734
[58] Field of Search ............... 364/734, 724, 715, 572, 364/575, 811, 825

[56] References Cited

U.S. PATENT DOCUMENTS 4,193,118  3/1980  Nash et al. ........................ 364/734
4,606,009  8/1986  Wiesmann ........................ 364/724

FOREIGN PATENT DOCUMENTS 3121310  12/1982  Fed. Rep. of Germany .
3342739  5/1984   Fed. Rep. of Germany .
59-188262 10/1984 Japan ................................. 364/734
1523729  9/1978   United Kingdom .

OTHER PUBLICATIONS

Hölzler, E. et al., Pulstechnik, vol. I, Grundlagen Springer-Verlag, (1982), pp. 277 to 280.

Primary Examiner—Gary V. Harkcom
Assistant Examiner—Tan V. Mai
Attorney, Agent, or Firm—Fisher, Christen & Sabol

[57] ABSTRACT

For averaging in the case of a signal consisting of rectangular pulses, a circuit arrangement which provides the instrumentability for carrying out moving averaging over specific periods of time which are defined by the intervals between the successive pulse edges of the signal. The amplitude of the pulse sequence is assumed to be constant. Then the arithmetic mean is determined from a specific number of the preceding results of moving averaging.

5 Claims, 3 Drawing Sheets

CIRCUIT ARRANGEMENT FOR AVERAGING

FIELD OF THE INVENTION

The invention relates to a circuit arrangement for averaging in the case of a signal consisting of rectangular pulses, on the basis of a time and amplitude-discrete filter.

BACKGROUND ART

Time averaging of signals consisting of rectangular pulses can be effected, e.g., by integration over at least one period of the rectangular signal or by low-pass filtering. Integration can be carried out by means of an up-down counter. A drawback for a processor, however, is then the necessary division by the value of the period, which may be relatively time-consuming.

In the case of low-pass filtering, the definite integral is replaced by an indefinite integral over the range $-\infty \leq t \leq +\infty$. Accordingly, the transient response of the filter has to be taken into account, as otherwise the results are not exact.

Digital low-pass filters represent periodic networks with alternating pass and stop bands. As a pulse-shaped signal may have spectral components over a very wide frequency range, very accurate tuning of the low pass filter response and clock frequency with respect to the signal is necessary. The essential drawback of the low-pass filter consists in the high stop-band attenuation that has to be implemented. Because of these problems, excessively sophisticated circuitry will have to be implemented in order to achieve acceptable results.

BROAD DESCRIPTION OF THE INVENTION

The object of the present invention is to develop a filter which can be implemented with lower effort than is required for conventional arrangements and which is characterized by a very large ratio of clock frequency to pass bandwith and which enables accurate averaging.

According to the invention, this object is reached by providing means for carrying out moving averaging over specific periods of time which are defined by the variable intervals between the successive pulse edges of the input signal, the amplitude of the pulse sequence being assumed to be constant, and by the fact that the arithmetic mean can then be determined from a specific number of the preceding results of moving averaging. According to the invention, arithmetic averaging is carried out over one cycle duration or over a multiple of the cycle duration. Preferred embodiments for the implementation of moving averaging according to the circuitry and for the subsequent determination of the arithmetic mean are described in subclaims 3 to 5.

The proposed filter according to the invention can be described in its simplest manner by the relation:

$$Y_n = Y_{n-1}(1-\alpha) + \alpha \cdot X_n$$

where $X_n$ is the input value at time $t_n$, $Y_n$ is the generative output value at time $t_n$, $Y_{n-1}$ is the output value at the preceding time $t_{n-1}$, and $\alpha$ is a factor which determines the transient response of the filter.

In the case of a signal consisting of rectangular pulses, it is assumed that the input function assumes only specific values, e.g. $X_+ = +1$ and $X_- = -1$ (see FIG. 1). If the input value is $X = X_+$ at time $t_o$, we obtain after n steps at time $t_n$ for $Y_n$ $$Y_n = Y_o(1-\alpha)^n + X_+ \cdot \alpha \sum_{m=0}^{n-1}(1-\alpha)^m$$

where $Y_o$ is the initial value of Y at time $t_o$.

This formula can be derived as follows:

$n = 1$   $Y_1 = Y_o(1-\alpha) + \alpha X_+$ $n = 2$   $Y_2 = Y_1(1-\alpha) + \alpha X_+$ $\qquad\qquad = Y_o(1-\alpha)^2 + (\alpha + \alpha(1-\alpha)) \cdot X_+$ $n = 3$   $Y_3 = Y_2(1-\alpha) + \alpha \cdot X_+$ $\qquad\qquad = Y_o(1-\alpha)^3 + (\alpha + \alpha(1-\alpha) + \alpha(1-\alpha)^2) \cdot X_+$ etc.

$$Y_n = Y_o(1-\alpha)^n + X_+ \cdot \alpha(1 + (1-\alpha) + \ldots (1-\alpha)^{n-1})$$

$$Y_n = Y_o(1-\alpha)^n + X_+ \cdot \alpha \sum_{m=0}^{n-1}(1-\alpha)^m$$

The term $$\alpha \sum_{m=0}^{n-1}(1-\alpha)^m$$

can be mathematically simplified as follows $$\alpha \sum_{m=0}^{n-1}(1-\alpha)^m = 1 - (1-\alpha)^n$$

This relation results from the summation equation for power series $$\sum_{m=0}^{n} q^m = \frac{1 - q^{n+1}}{1 - q} \text{ for } q \neq 1$$

by substitution of $q = 1 - \alpha$.

If the number of sample values is just $n_1$ during the period of time when X assumes the value $X_+$, $Y_{n1}$ is reached after $n_1$ values. Subsequently, a new cycle starts in which, accordingly, the amplitude value has to be set $X = X_-$.

The number of sample values now is $n = n_2$, the value of Y at the end of this cycle then is $Y_{n2}$. In the next cycle $X = X_+$ again. The number of sample values is $n = n_3$, the value of Y at the end of this cycle is $Y_{n3}$.

The relations for Y thus can be described by $$Y_{n1} = X_+ + (Y_o - X_+)(1-\alpha)^{n1}$$

$$Y_{n2} = X_- + (Y_{n1} - X_-)(1-\alpha)^{n2}$$

$$Y_{n3} = X_+ + (Y_{n2} - X_+)(1-\alpha)^{n3}$$

•

• etc.

Thus, calculation of the output values of the filter is necessary only at the end of each cycle within which X, i.e. the amplitude remains constant.

For an input signal with constant duty cycle, this can be represented as follows:

In the stationary state of the filter, the respective values are $$n_1 = n_3 = n_5 = \ldots$$

$$n_2 = n_4 = n_6 = \ldots$$

$$Y_o = Y_{n2} = Y_{n4} = \ldots$$

$$Y_o = \frac{X_+ (1-\alpha)^{n2}(1-(1-\alpha)^{n1}) + X_- (1-(1-\alpha)^{n2})}{1-(1-\alpha)^{n1+n2}}$$

$$Y_{n1} = Y_{n3} = Y_{n5} = \ldots$$

$$Y_{n1} = \frac{X_- (1-\alpha)^{n1}(1-(1-\alpha)^{n2}) + X_+ (1-(1-\alpha)^{n1})}{1-(1-\alpha)^{n1+n2}}$$

These values deviate from the nominal value which is to be expected in the ideal case at the output of the filter. This amounts to $$Y_o - Y_{n1} = \frac{n_1 - n_2}{n_1 + n_2} \cdot \frac{X_+ - X_-}{2} + \frac{X_+ + X_-}{2}$$

Selection of the parameters $n_1+n_2$ and $\alpha$ is effected such that, in order to achieve a specific time resolution, the sample values must succeed sufficiently close behind each other. Thus, $n_1+n_2$ is determined; the ration $n_1/n_2$ adjusts as a function of the duty cycle of the input signal. The transient response and/or the approximation behaviour of the filter is determined from the value $\alpha(n_1+n_2)$.

$\alpha$ can be selected from certain range of values and need not assume a specific value as in the case of the coefficients of conventional low-pass filters.

The values $\alpha(n_1+n_2)$ can now be selected to be so small that the error of the resulting $Y_{ni}$ values is sufficiently small as compared with the nominal value to be expected in the ideal case. This corresponds to the behaviour desired for the low-pass filter. In this case, however, the arithmetic mean is formed in addition $$Y'_{n1} = \frac{Y_o + Y_{n1}}{2}, \quad Y'_{n2} = \frac{Y_{n2} + Y_{n1}}{2}$$

It is $$Y'_{n1} = Y'_{n2} =$$

$$\frac{X_+ + X_-}{2} + \frac{X_+ - X_-}{2} \cdot \frac{((1-\alpha)^{n2} - (1-\alpha)^{n1}}{1-(1-\alpha)^{n1+n2}}$$

The deviation of this value from the ideal value now is substantially smaller than the deviations of the values $Y_o$ or $Y_{n1}$.

The circuitry of the filter according to the invention can be implemented in a much simpler manner and can be less sophisticated than this would be possible in the case of conventional low-pass filtering for averaging pulse signals as described in the foregoing. Both moving and arithmetic averaging requires essentially only subtracters and adders.

BRIEF DESCRIPTION OF THE INVENTION

The invention is described in detail on the basis of the schematic drawings.

DETAILED DESCRIPTION OF THE INVENTION

Figure 1:
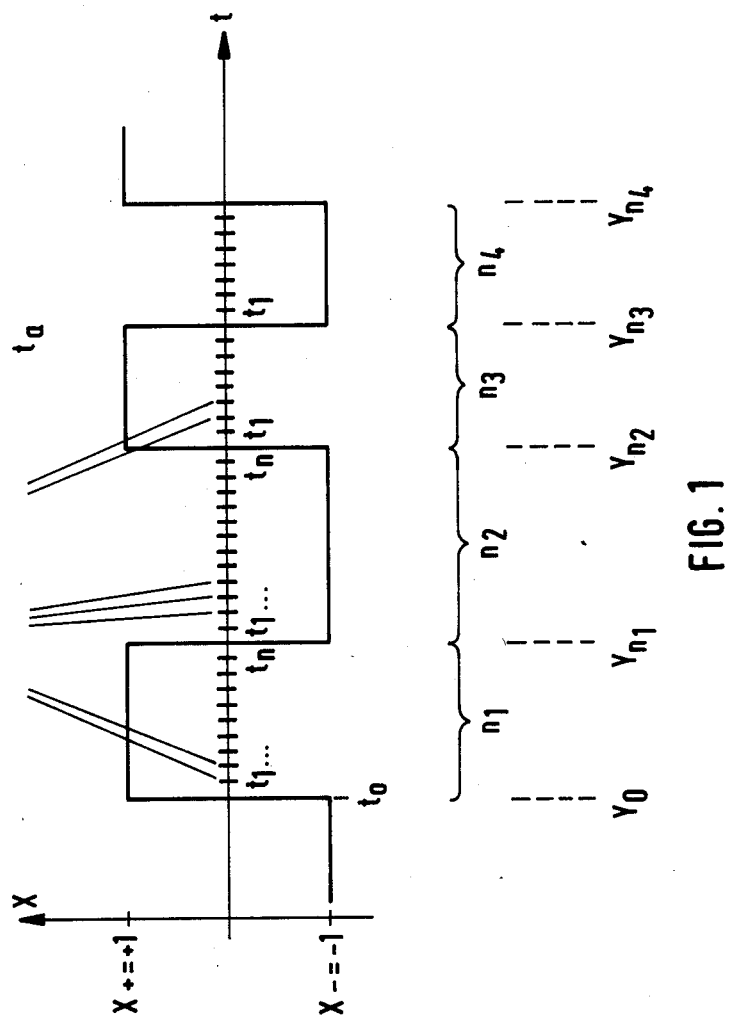
FIG. 1 shows the sampling times of the digital filter according to the invention for the input signal.

FIG. 1 shows the pulse sequence of the input signal X versus time t. This input function can assume only specific values, e.g. $X_+ = +1$ and $X_- = -1$. $t_1$ to $t_n$ are the sampling times between two pulse edges; they are newly generated after each pulse edge. $n_1$ to $n_n$ represent the numbers of sample values, and, correspondingly, generative initial or final values $Y_o$, $Y_{n1}$, $Y_{n2}$..., etc., are obtained. $Y_o$ is the initial value of Y at time $t_o$ and, e.g., $Y_{n3}$ is the value at time $t_{n3}$.

Figure 2:
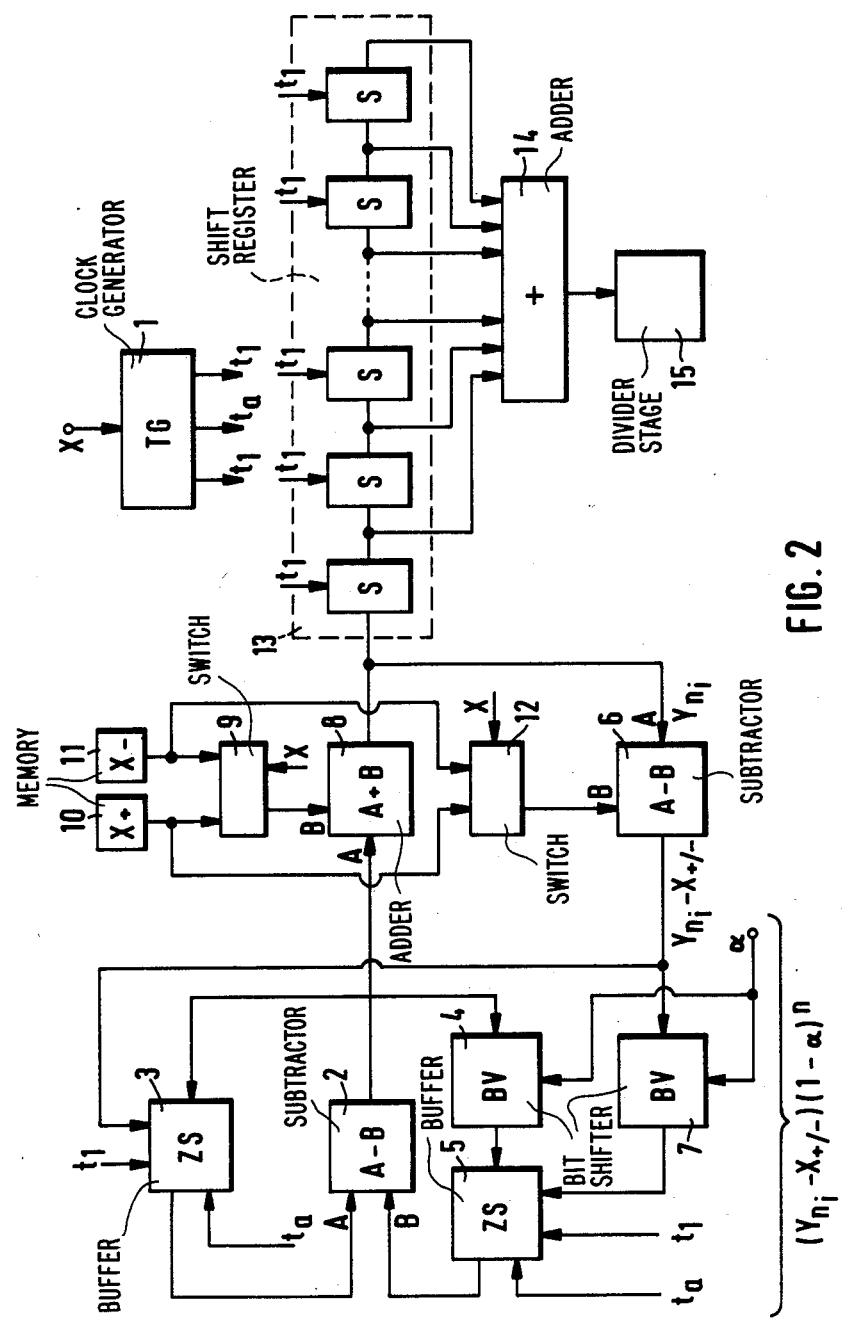
FIG. 2 shows a preferred embodiment for the implementation of the circuitry.

FIG. 2 shows a possible circuit arrangement for the realization of the filter according to the invention. The clock generator 1 generates a periodic sampling signal $t_a$ in such a manner that certain number of pulses is generated within one cycle duration of the input signal. The number of sampling signals $t_a$, together with the factor $\alpha$, determines the transient response of the filter and the accuracy with which the final signal is approximated. As is shown in FIG. 1, the sampling signal $t_1$ is generated at the first sampling signal within each cycle of X, i.e. when X changes from $X_-$ to $X_+$ or from $X_+$ to $X_-$. The pulse $t_1$ starts the circuitry for determining $(Y_{ni-1}-X_{+/-}) \cdot (1-\alpha)^n$.

The factor $\alpha$ is selected to be a power of $\frac{1}{2}$ so that, in case of binary representation of the final signal, multiplication by $\alpha$ can be carried out by bit shifting by k bit. Multiplication of a binary number by $(1-\alpha)$ thus can be effected by subtraction of the value shifted by k bit from the original value. To this end, the output signal of the substracter 2 is fed back to the two inputs of the substracter 2, i.e. direct via the buffer 3 and shifted by k bit via the bit shifter 4 and the buffer 5, so that the preceding value, multiplied by $(1-\alpha)$, is available at the output of the substracter 2 after each sampling pulse $t_a$. At the start of each cycle, i.e. at $t_1$, the value $$(Y_{ni-1}-X_+) \text{ or } (Y_{ni-1}-X_1)$$

which is available at the output of the substracter 6, is fed into the buffer 3 or, shifted by k bit, into the buffer 5 via bit shifter 7.

In the adder 8, the values $X_+$ and $X_-$ are added to $$(Y_{ni-1}-X_+)(1-\alpha)^n \text{ and}$$

$$(Y_{ni-1}-X_-)(1-\alpha)^n \text{ respectively.}$$

Depending on the state of the signal X, the values for $X_+$ and $X_-$ are taken from the memories 10 and 11, respectively, via switch 9, and fed to the adder 8. The value $Y_{ni}$ thus is available at the output of 8 at the end of each cycle.

In the substracter 6, the values $X_-$ and $X_+$ respectively, are subtracted from $Y_n$. Depending on the state of X, the respective value is taken from the memories 10 or 11 via the switch 12. At the output of the substracter 6, the initial value of $(Y_{ni}-X_+)$ or $(Y_{n1}-X_-)$ is thus available for the next cycle.

Other circuit arrangements which effect the same mathematical algorithm are conceivable, e.g. exchanges of the sequence of 4 and 5 or 7 and 5, combination of the buffers 3 and 4, multiple access of the adders or substracters 2, 6 and 8.

At the start of a new cycle, the output values of the adder 8 are fed into the first storage cell of a shift register 13, the values fed in previously being shifted by one storage cell. The number of storage cells of the shift register 13 corresponds to the number of pulse edges of X, i.e. from $X_+$ to $X_-$ or from $X_-$ to $X_+$, within one period of the input signal X, or is an integral multiple thereof. To form the arithmetic mean, the output values of the individual storage cells are fed to an adder 14, at the output of which a divider stage 15 can be provided.

Figure 3:
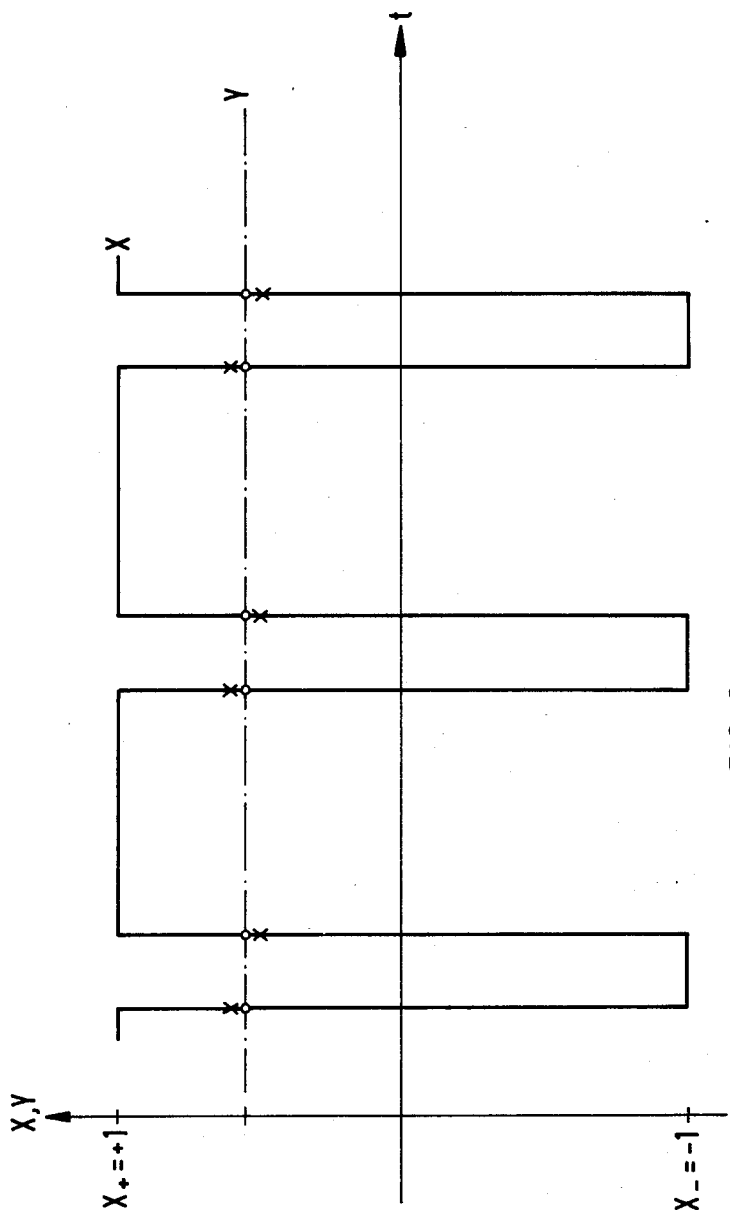
FIG. 3 shows the behaviour of the filter according to the invention.

FIG. 3 shows the values of $Y_{n1}$ or Y for a specific shape of X. $Y_{Soll}$ designates the nominal value of the average of X. The values of $Y_{ni}$, which result after each cycle, are marked by crosses. They deviate from the nominal value by certain amounts. The values of Y at the output of adder 14, which also result after a cycle, are marked by circles. They deviate from the nominal value only by very small amounts.

The advantage of this filter over a conventional digital low-pass filter consists in the fact that conventional low-pass filters, which are to achieve the same filtering properties, require a very high degree of filtering, and that the multiplication stages required by conventional filters are not necessary.

What is claimed is:

1. Circuit arrangement for averaging with an input signal consisting of square-wave pulses with a maximum level, which is the signal level when a pulse is applied, and a minimum level, which is the signal level during the pulse gap, based on a discrete time and value filter, with a clock pulse generator (1) by which clock pulses ($t_a$) are continuously generated according to a sampling rate and that at least one multiplier (7, 4) is placed upstream in a branch of a subtractor (2), which subtracts two signals from each other and generates an output signal, as well as an adder (8), which adds two signals and generates an output signal, as well as with at least one latch (3, 5), characterized in that the output signal of first subtractor (2) is carried, by a first latch (3), which delays this output signal by one clock pulse ($t_a$) of clock pulse generator (1), to the one input of the subtractor and by a first multiplier (4), which multiplies the output signal of first subtractor (2) by a factor, and by a latch (5), which delays the output signal of multiplier (4) by one clock pulse ($t_a$) of clock pulse generator (1), and is carried to the other input of subtractor (2), in which this signal is subtracted from the output signal of first latch (3), and in that the output signal of first subtractor (2) is carried to the one input of adder (8), and in that signal values of different magnitudes from a first and a second additional latch (10, 11) are carried to the other input of adder (8) depending on input signal (X) and, with a selector module (9), the first signal value is further evaluated only if the maximum level is present at the input signal and the second signal is added if the minimum level is present at the input signal, and in that a second subtractor (6) is provided, to whose one input the output signal of adder (8) is carried and to whose other input, depending on input signal (X), the other signal in each case from additional latches (10, 11) is carried, and with selector module (12), the second signal value is carried further only if the maximum level is present at the input signal and the first signal value is added if the minimum level is present at the input signal, and output signal (B) of second selector module (12) is substrated from the output signal of subtractor (8), and in that the output signal of second subtractor (6) is carried to first latch (3) and to second latch (5) by a second multiplier (7), and clock pulse generator (1) additionally generates, at each edge of input signal (X), a synchronous pulse ($t_1$), and in that when the synchronous pulse is applied, the output signal of second subtractor (6) instead of the output signal of first subtractor (2) is accepted in second latch (3), and the output signal of second multiplier (7) instead of the output signal of first multiplier (4) is accepted in second latch (5), and the signal applied at the output of adder (8) represents a measurement for the variable average of the input signal.

2. Circuit arrangement according to claim 1 wherein the signal applied at the output of adder (8) is stored, at every synchronous pulse ($t_1$), in the first storage location of a shift register (13), and the number of storage locations corresponds to the number of edges of the pulse train within its period or to a multiple thereof, and wherein in an adder (14) the signal values of the individual storage locations are added and the sum is then optionally divided by the number of storage locations.

3. Circuit arrangement according to one of claims 1 or 2 wherein, to achieve an optimal transient response, the sampling rate of clock pulse generator (1) and the multiplication factor in multipliers (4, 7) are matched to each other.

4. Circuit arrangement according to claim 3 wherein the multiplication in multipliers (4, 7) is carried out by bit shifting.

5. Circuit arrangement according to one of claims 1 or 2 wherein the multiplication in multipliers (4, 7) is carried out by bit shifting.

* * * * *